United States Patent
Jang et al.

(10) Patent No.: US 7,902,932 B2
(45) Date of Patent: Mar. 8, 2011

(54) VARIABLE-FREQUENCY OSCILLATOR

(75) Inventors: Yu Jin Jang, Gyunggi-do (KR); Byoung Own Min, Gyunggi-do (KR); Seung Kon Kong, Gyunggi-do (KR); Sang Cheol Shin, Gyunggi-do (KR); Jung Chul Gong, Seoul (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 148 days.

(21) Appl. No.: 12/166,885

(22) Filed: Jul. 2, 2008

(65) Prior Publication Data

US 2009/0009256 A1 Jan. 8, 2009

(30) Foreign Application Priority Data

Jul. 3, 2007 (KR) .................. 10-2007-0066745

(51) Int. Cl.
*H03K 3/233* (2006.01)
*H03K 3/37* (2006.01)
(52) U.S. Cl. .................. 331/143; 331/17; 331/186
(58) Field of Classification Search .................. 331/143, 331/185, 186, 16
See application file for complete search history.

(56) References Cited

U.S. PATENT DOCUMENTS

| | | | |
|---|---|---|---|
| 5,731,695 A | 3/1998 | Shioda et al. | |
| 6,188,289 B1 | 2/2001 | Hyeon | |
| 6,456,170 B1 | 9/2002 | Segawa et al. | |
| 6,680,656 B2 | 1/2004 | Chen | |
| 6,856,204 B2 * | 2/2005 | Kwon | 331/17 |
| 7,420,431 B2 | 9/2008 | Hwang et al. | |
| 7,538,626 B2 * | 5/2009 | Yamaguchi et al. | 331/57 |
| 2006/0132250 A1 | 6/2006 | Bakker | |

FOREIGN PATENT DOCUMENTS

| | | |
|---|---|---|
| JP | 63135006 A | 6/1988 |
| JP | 10242783 A | 9/1998 |
| KR | 10-0272170 B1 | 8/2000 |
| KR | 10-2007-0058252 A | 6/2007 |

OTHER PUBLICATIONS

Textbook Series for 21st Century.
Chinese Office Action for Application No. 200810126476.4 issued on Apr. 6, 2010.
Chinese Office Action for Application No. 200810126476.4 dated Oct. 21, 2010.

* cited by examiner

*Primary Examiner* — Robert Pascal
*Assistant Examiner* — James E Goodley
(74) *Attorney, Agent, or Firm* — Lowe Hauptman Ham & Berner LLP

(57) ABSTRACT

There is provided a frequency-variable oscillator that varies, even when a frequency of an input signal is varied, a frequency of an oscillation signal according to the varied frequency of the input signal. The frequency-variable oscillator includes: a voltage-to-current converter circuit for converting a voltage level of an input signal into a current level within a predetermined range; and an oscillator circuit for varying a frequency according to the current level from the voltage-to-current converter circuit and oscillating the varied frequency.

4 Claims, 3 Drawing Sheets

VARIABLE-FREQUENCY OSCILLATOR

CROSS-REFERENCE TO RELATED APPLICATIONS

This application claims the priority of Korean Patent Application No. 2007-0066745 filed on Jul. 3, 2007, in the Korean Intellectual Property Office, the disclosure of which is incorporated herein by reference.

BACKGROUND OF THE INVENTION

1. Field of the Invention

The present invention relates to a variable-frequency oscillator, and more particularly, to a variable-frequency oscillator that varies, even when a frequency of an input signal is varied, a frequency of an oscillation signal according to the varied frequency of the input signal.

2. Description of the Related Art

Recently, liquid crystal displays (LCDs) have been widely used in a variety of display devices, such as monitors and televisions, to provide small, lightweight, and thin LCD products.

LCD backlight units that turn on lamps of the LCD to output necessary light are inevitably used in the LCD products. The LCD backlight unit includes a driving IC for driving the lamps according to a predetermined frequency. The driving IC includes an oscillator that provides the frequency.

Video signals, such as a horizontal synchronization signal and a vertical synchronization signal, which are used in an LCD panel, are used in the LCD product. The interference occurring between the frequency of the voice signal and the frequency of the driving IC may cause a waterfall or a flicker on the LCD product. Thus, the frequency of the voice signal and the frequency of the driving IC need to be synchronized with each other.

FIG. 1 is a configuration view illustrating an oscillator according to the related art.

Referring to FIG. 1, an oscillator 10 according to the related art performs a logic operation L according to comparison results from first and second comparators C1 and C2 that compare charging and discharging voltages with predetermined first and second reference signals, respectively, to generate a charging and discharging switching signal. A first current source CS1 and a second current source CS2 charge and discharge a capacitor C according to opening and closing of a switch SW that performs a switching operation according to the charging and discharging switching signal, so that the oscillator 10 outputs first and second output signals.

The oscillator according to the related art outputs the first and second output signals each having a fixed frequency. When the frequency of a voice signal is varied, the frequency of each of the first and second output signals cannot be synchronized with that of the video signal. Therefore, a waterfall or a flicker may occur on the LCD product.

SUMMARY OF THE INVENTION

An aspect of the present invention provides a variable-frequency oscillator that varies, even when a frequency of an input signal is varied, a frequency of an oscillation signal according to the varied frequency of the input signal.

According to an aspect of the present invention, there is provided a frequency-variable oscillator including: a voltage-to-current converter circuit converting a voltage level of an input signal into a current level within a predetermined range; and an oscillator circuit varying a frequency according to the current level from the voltage-to-current converter circuit and oscillating the varied frequency.

The voltage-to-current converter circuit may include: a voltage control unit converting the voltage level of the input signal to a predetermined voltage level; a voltage-to-current converting unit converting the voltage level from the voltage control unit to the current level within the predetermined range; and a current control unit controlling charging and discharging currents of the oscillator circuit according to the current level of the voltage-to-current converting unit.

The voltage control unit may include: a comparator comparing the voltage level of the input signal with a voltage level of a feedback voltage; and a voltage range controller controlling a level of an output voltage from the comparator to a predetermined voltage level range and providing the output voltage having the controlled level as the feedback voltage.

The voltage-to-current converting unit may include: a voltage-to-current converter converting a voltage from the voltage control unit into a current; and a current gain controller controlling a level of the current from the voltage-to-current converter to a predetermined current level range.

The current control unit may include: a current operator performing an operation of the current from the voltage-to-current converting unit and a predetermined reference current to output a first current and a second current having a predetermined ratio therebetween; a first current multiplier multiplying the first current from the current operator by a predetermined current level; and a second current multiplier multiplying the second current from the current operator by a predetermined current level.

The oscillator circuit may include: a charging and discharging unit determining charging and discharging currents according to currents from the first and second current multiplier; and a signal generating unit generating a first output signal by controlling the charging and discharging of the charging and discharging unit and a second output signal by comparing a voltage level of the first output signal with predetermined first and second reference voltages.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
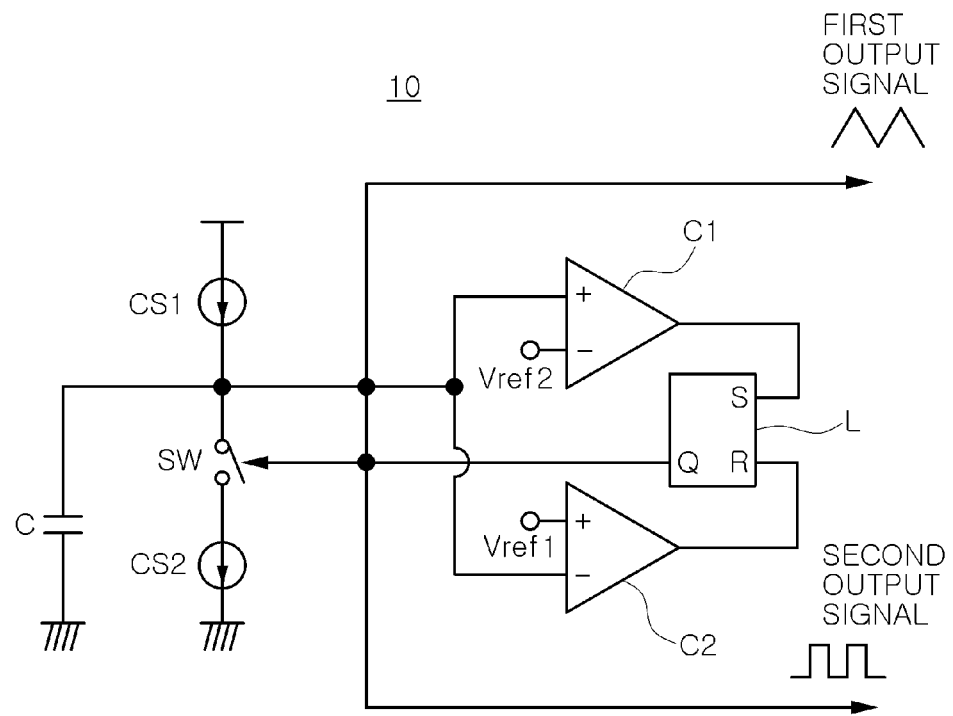
FIG. 1 is a configuration view illustrating an oscillator according to the related art.
Figure 2:
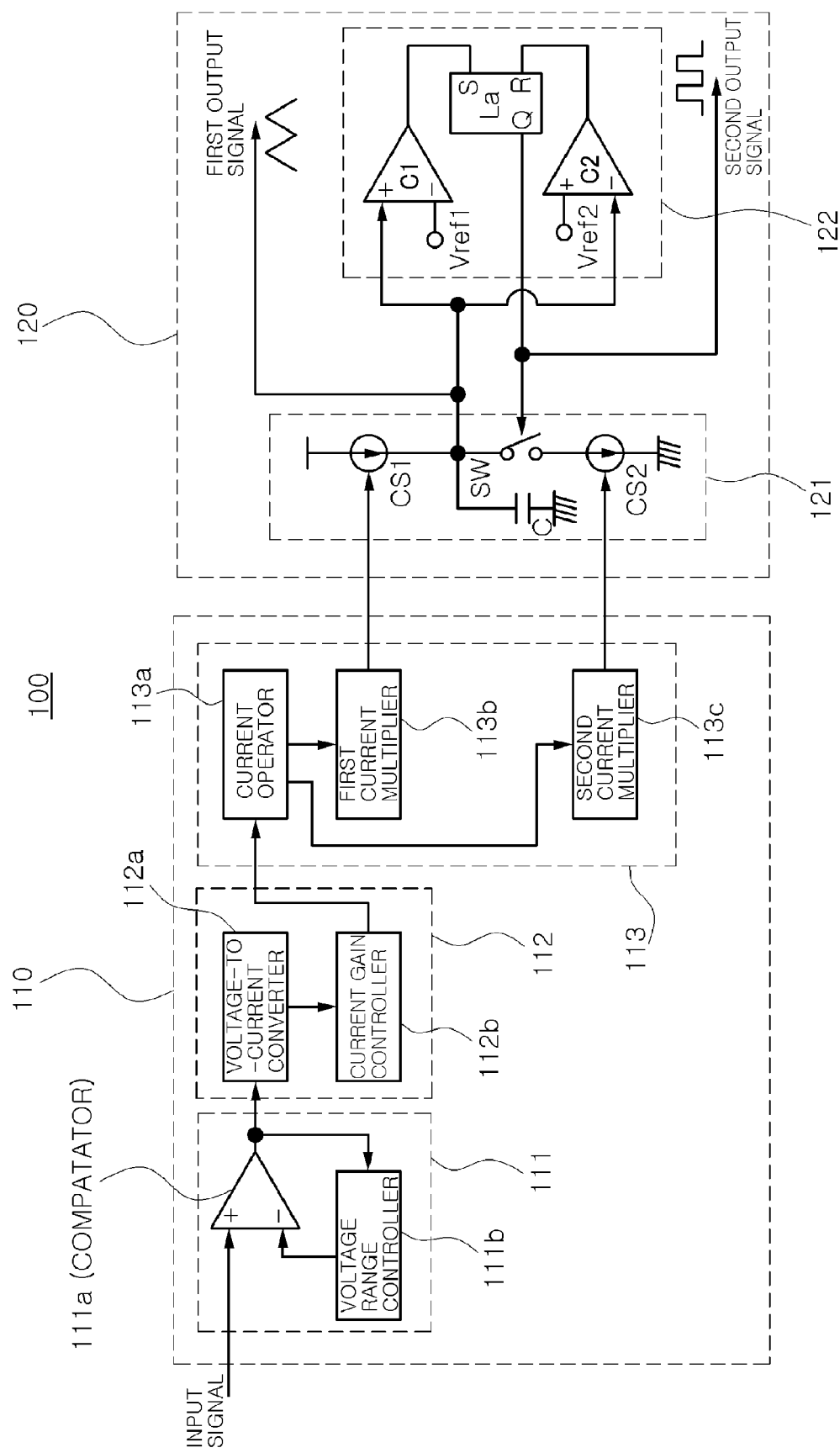
FIG. 2 is a configuration view illustrating an oscillator according to an exemplary embodiment of the present invention.

FIG. 2 is a configuration view illustrating an oscillator according to an exemplary embodiment of the invention.

Referring to FIG. 2, an oscillator 100 according to the embodiment of the invention may include a voltage-to-current converter circuit 110 and an oscillator circuit 120.

The voltage-to-current converter circuit 110 may include a voltage control unit 111, a voltage-to-current converting unit 112, and a current control unit 113.

The voltage control unit 111 may include a comparator 111a that compares a voltage level of an input signal with a voltage level of a feedback voltage, and a voltage range controller 111b that controls a voltage level range of an output signal form the comparator 111a.

The voltage-to-current converting unit 112 may include a voltage-to-current converter 112a that converts a voltage of the output signal from the comparator 111a into a current, and a current gain controller 112b that controls a level of the current from the voltage-to-current converting unit 112 to a predetermined level range.

The current control unit 113 may include a current operator 113a that performs an operation of the current from the current gain controller 112b and a predetermined reference current Cref, and a first current multiplier 113b and a second current multiplier 113c each of which multiplies the current from the current operator 113a by a predetermined current level.

The oscillator circuit 120 may include a charging and discharging unit 121 and a signal generating unit 122.

The charging and discharging unit 121 may include first and second current sources CS1 and CS2 that determine charging and discharging currents according to currents from the first and second current multipliers 113b and 113c, respectively, a switch SW that opens or closes a transmission path between the first current source CS1 and the second current source CS2, and at least one capacitor C that charges or discharges a current according to whether the switch SW opens or closes the transmission path.

The signal generating unit 122 includes first and second comparators C1 and C2 that compare a voltage level of a first output signal generated by the charging and discharging of the capacitor C with voltage levels of first and second reference voltages Vref1 and Vref2, respectively, and an RS latch La that outputs a second output signal according to comparison results of the first and second comparators C1 and C2.

Figure 3:
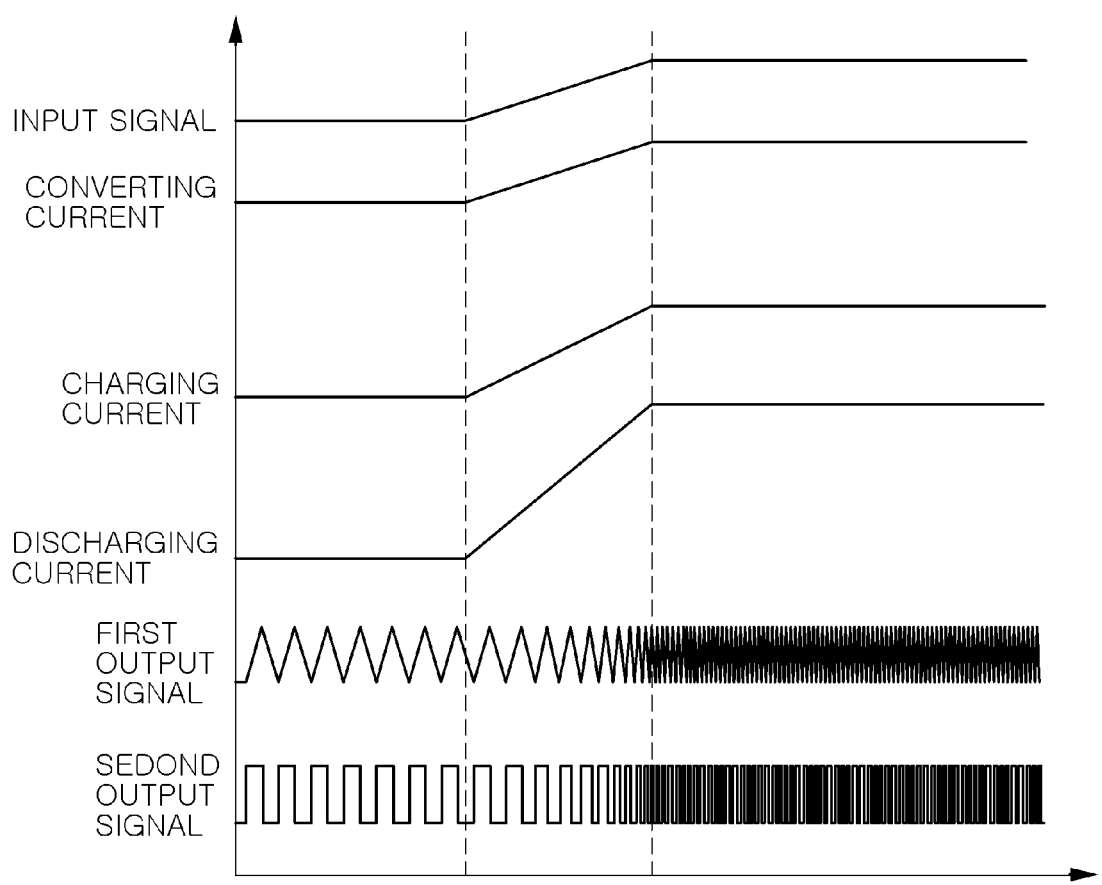
FIG. 3 is a signal waveform graph of parts of the oscillator according to the exemplary embodiment of the present invention.

FIG. 3 is a signal waveform graph of parts of an oscillator according to the embodiment of the present invention.

Referring to FIG. 3, even when a frequency of an input signal is varied, the oscillator according to the embodiment of the invention correspondingly varies a current, and thus a frequency of an oscillation signal is varied.

Hereinafter, the operation and effect of the invention will be described in detail.

Referring to FIGS. 2 and 3, first, an input signal has a voltage that can be changed according to a frequency. The voltage control unit 111 controls a voltage level of the input signal to a predetermined voltage level range by using the comparator 111a and the voltage range controller 111b. In this way, the voltage level of the input signal is controlled to a voltage level appropriate for signal processing. For example, when the input signal is in a voltage level range from 1 to 10V, the voltage level range of the input signal is controlled to a voltage level range of 0.1 to 1V appropriate for signal processing.

The voltage having the controlled voltage level is transmitted to the voltage-to-current converting unit 112. The voltage-to-current converter 112a of the voltage-to-current converting unit 112 converts the voltage with the controlled level into a current, and the current gain controller 112b amplifies the current from the voltage-to-current converter 112a so that the current from the voltage-to-current converter 112a has a current level within the predetermined current level range.

The gain-controlled current is transmitted to the current control unit 113. The current operator 113a of the current control unit 113 performs an operation of the gain-controlled current and a predetermined reference current and transmits currents to the first and second current multipliers 113b and 113c. Here, the current operator 113a may perform the operation of the gain-controlled current and the predetermined reference voltage at a predetermined ratio, and add or subtract the gain-controlled current and the reference current from each other according to the multitude of the gain-controlled current.

The current operator 113a performs the operation of the gain-controlled current the reference current, and then transmits the current at a predetermined ratio to the first and second current multipliers 113b and 113c, respectively.

Here, the current may be transmitted to the first and second current multipliers 113a and 113b at a ratio of 1:2.

The first and second current multipliers 113a and 113b multiply the transmitted currents and transmit the multiplied currents to the first current source CS1 and second current source CS2, respectively.

Since the current charged in the capacitor C is from the first current source CS1, a discharging current from the second current source CS2 may be the sum of the current of the capacitor C and the current of the first current source CS1. Therefore, preferably, the current may be transmitted to the first and second current multipliers 113a and 113b at the ratio of 1:2.

The first current source CS1 of the charging and discharging unit 121 determines the charging current according to the current from the first current multiplier 113a, and the second current source CS2 of the charging and discharging unit 121 determines the discharging current according to the current from the second current multiplier 113c.

The current from the first current source CS1 is charged in the capacitor C, and the current charged in the capacitor C is discharged by the second current source CS2. Here, switching between the charging and discharging is performed by the switch SW that opens or closes the transmission path between the first current source CS1 and the second current source CS2.

The switching operation of the switch SW is performed by the signal generating unit 122. First, the switch SW is switched on to connect the transmission path, the current is correspondingly charged in the capacitor, and a voltage charged in the capacitor C is also increased. The first comparator C1 compares the predetermined first reference voltage Vref1 with the voltage charged in the capacitor C and transmits a result of the comparison to the RS latch La. The RS latch La outputs a control signal for switching off the switch SW. The switch SW is switched off and short-circuits the transmission path. The voltage charged in the capacitor C drops. The second comparator C2 compares the predetermined second reference voltage Vref2 with the voltage discharged from the capacitor C and transmits a result of the comparison to the RS latch La. The RS latch La outputs a control signal for switching on the switch SW.

The charging and discharging voltage of the capacitor C become the first output signal having a triangle wave or a sawtooth wave, and the switching control signal of the RS latch La becomes the second output signal having a pulse wave.

Referring to FIG. 3, when the frequency of the input signal increases, the voltage of the input signal correspondingly increases. In the oscillator 100 according to the embodiment of the invention, the converted current increases according to the increase in voltage of the input signal, and the charging and discharging currents correspondingly increase.

This causes a change in the frequency of each of the first and second output signals. The frequency of each of the first and second output signal increases according to the increase in voltage of the input signal.

As described above, the oscillator 100 according to the embodiment of invention outputs an oscillation signal with a frequency that can be varied according to the frequency of the input signal.

As set forth above, according to the exemplary embodiment of the invention, even when a frequency of an input signal is varied, a voltage of the input signal is converted into a current, an oscillation frequency is varied according to the variation in current, so that an oscillation signal that is synchronized according to the variation in frequency of the input signal can be output.

While the present invention has been shown and described in connection with the exemplary embodiments, it will be apparent to those skilled in the art that modifications and variations can be made without departing from the spirit and scope of the invention as defined by the appended claims.

What is claimed is:

1. A frequency-variable oscillator comprising:
   a voltage-to-current converter circuit converting a voltage level of an input signal into a current level within a predetermined range, wherein the voltage-to-current converter circuit comprises,
      a voltage control unit converting the voltage level of the input signal to a predetermined voltage level, wherein the voltage control unit comprises a comparator comparing the voltage level of the input signal with a voltage level of a feedback voltage, and a voltage range controller controlling a level of an output voltage from the comparator to a predetermined voltage level range and providing the output voltage having the controlled level as the feedback voltage;
      a voltage-to-current converting unit converting the voltage level from the voltage control unit to the current level within the predetermined range; and
      a current control unit controlling charging and discharging currents of the oscillator circuit according to the current level of the voltage-to-current converting unit; and
   an oscillator circuit varying a frequency according to the current level from the voltage-to-current converter circuit and oscillating the varied frequency.

2. The frequency-variable oscillator of claim 1, wherein the voltage-to-current converting unit comprises:
   a voltage-to-current converter converting the voltage from the voltage control unit into a current; and
   a current gain controller controlling a level of the current from the voltage-to-current converter to a predetermined current level range.

3. The frequency-variable oscillator of claim 1, wherein the current control unit comprises:
   a current operator performing an operation of the current from the voltage-to-current converting unit and a predetermined reference current to output a first current and a second current having a predetermined ratio therebetween;
   a first current multiplier multiplying the first current from the current operator by a predetermined current level; and
   a second current multiplier multiplying the second current from the current operator by a predetermined current level.

4. The frequency-variable oscillator of claim 3, wherein the oscillator circuit comprises:
   a charging and discharging unit determining charging and discharging currents according to currents from the first and second current multipliers; and
   a signal generating unit generating a first output signal by controlling the charging and discharging of the charging and discharging unit and a second output signal by comparing a voltage level of the first output signal with predetermined first and second reference voltages.

\* \* \* \* \*